(12) United States Patent
Roshau

(10) Patent No.: US 6,928,371 B1
(45) Date of Patent: Aug. 9, 2005

(54) MONITORING SYSTEM OF VRLA BATTERY CAPACITANCE

(76) Inventor: Paul T. Roshau, 306 S. Court St., Lewisburg, WV (US) 24901

(*) Notice: Subject to any disclaimer, the term of this patent is extended or adjusted under 35 U.S.C. 154(b) by 435 days.

(21) Appl. No.: 09/779,107

(22) Filed: Feb. 8, 2001

Related U.S. Application Data
(60) Provisional application No. 60/181,142, filed on Feb. 8, 2000.

(51) Int. Cl.$^7$ .................................................. H02J 7/00
(52) U.S. Cl. ........................ 702/63; 320/132; 320/136
(58) Field of Search .................... 320/116, 118, 320/119, 120, 132, 134, 135, 136; 702/63; 706/906, 907, 908, 911, 914, 915

(56) References Cited

U.S. PATENT DOCUMENTS

| | | | |
|---|---|---|---|
| 5,825,156 A | * 10/1998 | Patillon et al. | ............... 702/63 |
| 5,936,385 A | * 8/1999 | Patillon et al. | ............. 320/136 |
| 6,064,180 A | * 5/2000 | Sullivan et al. | ............. 320/132 |
| 6,211,654 B1 | * 4/2001 | O'Sullivan | .................. 320/149 |
| 6,285,163 B1 | * 9/2001 | Watanabe et al. | ........... 320/132 |
| 6,317,697 B1 | * 11/2001 | Yoshikawa et al. | ........... 702/63 |
| 6,456,988 B1 | * 9/2002 | Singh et al. | .................... 706/2 |
| 6,498,491 B2 | * 12/2002 | Plow et al. | ................. 324/426 |
| 6,504,344 B1 | * 1/2003 | Adams et al. | ............... 320/132 |
| 6,532,425 B1 | * 3/2003 | Boost et al. | .................. 702/63 |
| 6,611,774 B1 | * 8/2003 | Zaccaria | ....................... 702/63 |
| 2001/0022509 A1 | * 9/2001 | Schulmayr et al. | .......... 320/132 |
| 2003/0061182 A1 | * 3/2003 | Singh et al. | .................... 706/2 |
| 2003/0074335 A1 | * 4/2003 | Singh et al. | .................... 706/2 |
| 2003/0184307 A1 | * 10/2003 | Kozlowski et al. | .......... 324/427 |

OTHER PUBLICATIONS

IEEE Recommended Practice for Maintenance, Testing, and Replacement of Valve–Regulated Lead–Acid (VRLA) Batteries for Stationary Applications, 1996.*

Pascoe et al., "Adaptive Fuzzy Coup de Fouet Based VRLA Battery Capacity Estimation", IEEE, Oct. 7–10, 2001.*

* cited by examiner

Primary Examiner—Patrick Assouad
(74) Attorney, Agent, or Firm—Jagtiani & Guttag

(57) ABSTRACT

A method and apparatus for monitoring the capacity of a valve regulated lead acid battery comprising at least one battery monitor connected to the valve regulated lead acid battery; a centralized system connecting the battery monitor through an industry standard data system to a central office; and an alarm connected to the centralized system; wherein, a short-term discharge test is performed on the battery using the battery monitor which provides input parameters for a neural network and fuzzy logic network used in combination with a prediction algorithm to calculate the predicted capacity; and, wherein, the alarm is activated when said predicted capacity falls below eighty percent, when an individual cell voltage is reduced to 1.95 volts or less, or when a system failure occurs

20 Claims, 1 Drawing Sheet

Block Diagram for PowerCheck Battery Monitoring System

MONITORING SYSTEM OF VRLA BATTERY CAPACITANCE

This application is a nonprovisional application of provisional patent application serial No. 60/181,142 filed on Feb. 8, 2000, this disclosure of which is incorporated herein by reference, as though in full.

BACKGROUND OF THE INVENTION

1. Field of the Invention

2. Brief Description of the Prior Art

Valve regulated lead acid batteries (VRLA) were introduced in the late 1980's as "maintenance free." In this type of battery, oxygen and hydrogen produced during electrochemical reactions in the battery recombine to maintain an aqueous liquid electrolyte at a constant level with the cell. As a result, these batteries have only a small amount of liquid electrolyte. Discharge of a VRLA battery module to a current compensated voltage of less than substantially 1.5 volts significantly increases the likelihood of irreversible conversion of the active battery material, lead oxide, to lead sulfate due to pinch-off or isolation effects. A drop in capacity proportional to the damage subsequently results.

When VRLA batteries are being charged, they often suffer a charge deficit that cumulatively increases with each charge. The amount of charge deficit varies from battery to battery and those with a smaller deficit are referred to as "more receptive" to charging current and those with a large deficit are "less receptive." One way of compensating for the charge deficit of a battery is to increase the voltage to which the battery is charged, i.e. the "float" voltage. When the voltage of a battery reaches a manufacturer specified float-voltage, it is deemed fully charged. However, increasing the float-voltage to remedy the charge deficit of a less receptive battery can overcharge those batteries in the string that are more receptive. Overcharging causes disassociation of the electrolyte and consequent gas pressurization in a VRLA battery. If the pressure exceeds the relief valve setting, gas escapes and electrolyte is lost, with permanent loss of capacity as the result. The mismatch in charge receptivity grows with the number of charge cycles. When one battery in the string finally suffers an unacceptable loss of capacity, all of the batteries in the string must usually be discarded, although many of them have substantial useful life remaining.

SUMMARY OF THE INVENTION

A method and apparatus for monitoring the capacity of a valve regulated lead acid battery is disclosed that includes connecting at least one battery monitor to the valve regulated lead acid battery, connecting the battery monitor to a central office through a centralized system using an industry standard data system, and connecting an alarm to the centralized system. Short-term discharge tests are performed on the battery using the battery monitor, which provides input parameters for a neural network and fuzzy logic network used in combination with a prediction algorithm to calculate the predicted capacity. The alarm is activated when said predicted capacity falls below eighty percent, when an individual cell voltage is reduced to 1.95 volts or less, or when a system failure occurs.

In the preferred embodiment of the invention, the battery monitor consists of hardware for monitoring the voltages of each battery cell and currents that are flowing into and out of the battery, and, further, the monitor contains a serial port enabling data to be downloaded onto a network, computer, or printer as well as a real time clock which stamps the tests and data.

The short-term discharge test is preferably a four hour test during which the battery monitor acquires specific data parameters including the cell age, open circuit voltage, voltage after one hour of discharge, voltage after three hours of discharge, and voltage after four hours of discharge. These parameters are used by the neural network to derive three additional parameters including the slope of discharge curve, the delta between the voltages at three and four hours, and the proximity to two volts of the four-hour voltage.

The four-hour discharge test is performed repeatedly as necessary on the battery, while the neural network is trained only once for a specific kind of battery. The neural network is trained in a lab by determining the actual capacity of a battery then using this actual capacity along with the various parameters noted previously to yield a set of neural network coefficients that are used by the fuzzy logic network and the neural network combined with the prediction algorithm to predict the battery capacity.

BRIEF DESCRIPTION OF THE DRAWINGS

The advantages of the instant disclosure will become more apparent when read with the specification and the drawings, wherein.

DETAILED DESCRIPTION OF THE INVENTION

Figure 1:
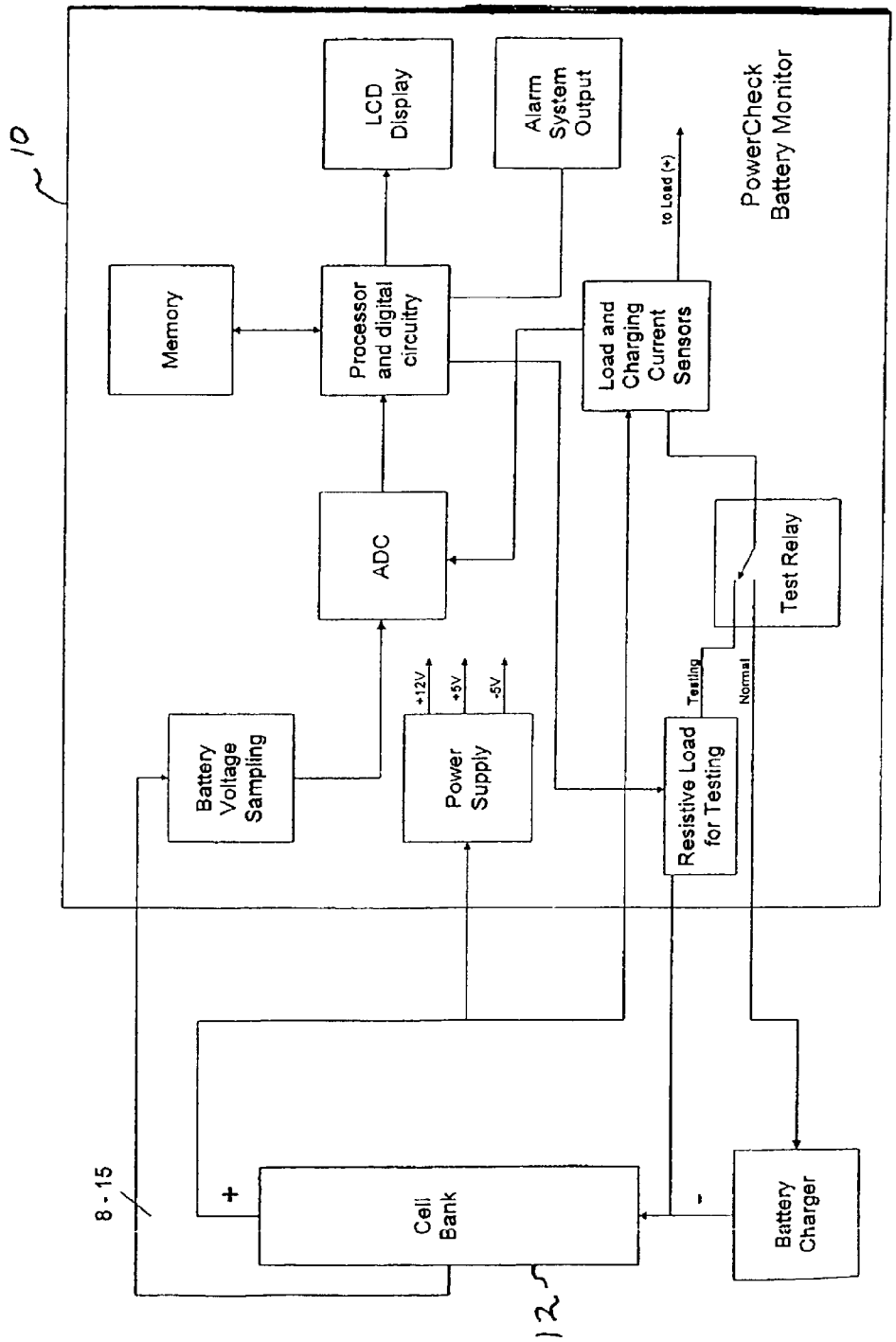
FIG. 1 is a block diagram for the disclosed monitoring system.

It is desirable to be able to predict capacity of batteries used in back-up application. An example of a typical back up system that relies on the batteries would be at railroad crossings for the barrier and warning light activation in case of a power failure.

Most batteries exhibit a discharge curve that will allow the use to accurately predict battery capacity. The exception is the VRLA batteries. These sealed, "dry" cell batteries have a very flat discharge curve until capacity reaches a very low value, about ten-percent (10%). At this point, this battery terminal voltage will drop dramatically. The prior art method for determining capacity of these batteries is to discharge the batteries to the lowest system value of 1.75V, and compare the actual time to the calculated time, i.e.

$$\text{Capacity} = \frac{\text{Actual}}{\text{Calculated}} \times 100\%$$

This method is impossible to use in most, if not all, VRLA back-up systems. Unlike primary systems, where the battery can be out of service for a short period of time, because of a back-up system, back-up system batteries must be available at all times in the event of primary system failure. For any type of back-up battery system, the discharge of the batteries to 1.75V would leave the batteries in a heavily discharged condition. In this condition, if the batteries were needed as a back-up power source, they would quickly fail to provide the required current.

It has been determined that a neural network, in combination with a novel prediction algorithm, can be configured to accurately predict the VRLA battery capacity. The basic neural net was designed by Matlab and was modified to determine the weighting coefficients for the prediction algorithm. The input parameters to the neural net were "fuzzified" to incorporate the prediction algorithm's math functionality needed to predict the capacity. However, any equivalent software that can be modified to accept the algorithm as disclosed herein can be used. The capacity prediction algorithm consists of two steps that, when used in combination, provide an unprecedented level of accuracy. The first step is a fizzy logic process that determines the wide range of standardized capacity values for which the particular cell will qualify. The second step uses the neural network to reduce the wide capacity range to a narrow range of approximately 15–20%. The fuzzy logic process contains membership sets of capacity ranges. A membership defines how each point in the input space is mapped to a degree of membership. The degree of membership within a particular capacity range is determined by comparing the cell under test voltages with historical cell voltages from standard cells of the same type. The capacity ranges with positive membership values are used to provide the overall capacity range limits in which the current cell will qualify. The neural network takes the data from the particular cell's four-hour discharge test and determines how much of the broad capacity range is kept.

In the physical arrangement of the disclosed, as illustrated in the block diagram of FIG. 1, the battery cells 12 are connected in series with a PowerCheck battery monitor 10. The battery monitor 10 consists of hardware for monitoring the voltages of the battery cells and currents that are flowing into and out of the batteries. All of the data that is needed for the prediction algorithm is acquired with the monitor 10.

The data required for the neural net is obtained from a short-term, four (4) hour, discharge of the battery. The testing of the battery is automatically run once a year and periodically, as preprogrammed by the system or through manual activation. The system can be preprogrammed to initiate testing of the batteries on any periodic basis. For example, on a monthly basis a twenty (20) minute catastrophic failure test is run to determine if a premature failure will occur on an individual cell. A typical battery bank consists of six (6) or seven (7) separate cells. The entire bank is tested, and the results logged into the system by bank, as well as cell by cell. The four (4) hour discharge is done at a discharge rate calculated from the amp-hour size of the battery and a 24-hour period. The system is monitored to maintain a constant current discharge regardless of load requirements Since in many instances these batteries are used for back up in critical safety areas, such as railroad crossings, even during testing the battery must not be depleted to the extent that it cannot provide immediate full load service. Therefore, the constant current load designed for testing uses a 24-hour load to provide enough data (time loaded) while not significantly depleting the battery. The testing procedure used is a load test recommended by IEEE (Institute of Electrical and Electronic Engineers). Specific data parameters from the four (4) hour test is fed directly into the prediction algorithm. The parameters used are the cells age, open circuit voltage, voltage after one hour of discharge, voltage after three hours of discharge and voltage after four hours of discharge. From these voltage values three additional data points are derived: the three hour slope is calculated from the one and four cell voltages, the delta between the three and four hour voltages and a slope adjusted data point calculated by the difference between the four hour voltage and 2 volts divided by the slope.

The process of learning and testing is as follows. In the lab, a bank of seven cells (same type and ampere-hour size) is fully charged and then discharged at the 24 hour rate until each cell's voltage is 1.75V. This process is done with a data logger/PC recording the cells voltage once per minute. The PowerCheck is used to provide the proper 24 hour rate load to the batteries. Once each cell reaches 1.75V, the actual capacity of the battery is determined by noting the length of time it takes the cell to discharge to 1.75V (typically around 26 hours for a 100% capacity battery). The actual capacity of the battery is determined by the formula: (time to discharge to 1.75V×24 hour discharge rate in amps)/(24×24 hour discharge rate in amps). The parameters that were mentioned above are used to train the neural network/ fuzzification network with the actual capacity value used as a target. The results of training a neural network yield a set of coefficients that are programmed into an EEPROM which is inserted in the PowerCheck battery monitor 10. This constitutes the training of the network.

The four hour tests that are performed at the site location of the PowerCheck (i.e. railroad crossings) use the neural network coefficients to predict the capacity of the batteries at that location. The four hour test logs the parameters mentioned above, inputs them into the neural network and the network outputs a predicted capacity. The parameters obtained from these four hour tests do not provide any additional training data beyond the 24 hour discharge tests performed in the lab. As more 24 hour discharge tests are performed in the lab, the actual capacity and cell voltage data are applied to the training data for the network and new, smarter coefficients are obtained. An example of typical data parameters for a VRLA battery set would be:

Open Circuit Voltage—13.5 volts DC, 2.25 volts per cell
Voltage minimum, while still enabling testing,—11.7 volts DC;
Dead battery voltage—10.5 volt D.C., 1.75 volts per cell
Voltage start—This is dependent upon load applied and charge of the battery. If load is applied for any length of time and the battery is fully charged, the voltage start will be close to the open circuit voltage.
Slope—approximately 6 millivolts per hour.

Upon setting up the unit, the age of the battery is entered. Based on the foregoing, the algorithm is fed the cell voltages at specified points in time, the algorithm is then able to obtain additional data points by manipulating the entered cell voltage data.

Since, by its nature, a neural network refines its processes as it "learns", as more data is obtained, the error margin will be reduced. The neural network predicts capacity at +/−10% error based on about 60 data sets. Optimum reliability in the training of neural networks is achieved by at least 50,000 data sets, thereby reducing the percentage of error.

Dependent upon the application, a variety of types of alarms, or different situations, will need to be activated. In the preferred embodiment, all of the batteries are connected to a centralized system through an industry standard data system, such as SCADA, that collects and transfers data from the field to a central office. In most instances, alarms will be activated if the individual cell voltage is reduced to 1.95 volts or less per cell for one or more cells; the capacity falls below 80%; or a system failure, such as a bad connection, occurs. A serial port in the battery monitor enables the data to be downloaded onto a network, laptop computer or printer. A real time clock that is, preferably, automatically verified and updated, if necessary, through the network, stamps the tests and data. The disclosed is an encapsulated system with any data transfer being from the unit to a laptop, modem or printer. The software used for the printer is contained within the unit and the software for the laptop/PC can be Windows HyperTerminal or an equivalent. The prediction algorithm receives data values from the batteries at one location. For each location and set of batteries, there is one battery monitor 10 that contains the prediction algorithm. Each Powerheck battery monitor 10 can accommnodate up to 7 cells in one set and additional sets will require an additional monitor 10.

The open, one, three and four hour cell voltages from the foregoing four (4) hour discharge are used in the fuzz portion of the algorithm. The total battery capacity (time to death) is broken into capacity spans of 10%. There is a voltage range associated with each of the 10 spans of battery capacities, which was determined from the previous 24-hour rate discharge lab tests. Each of the open, one, three and four hour cell voltage are compared with the known base lines for the specific battery type to determine which capacity spans the voltages ranges fall within. For example, a one-hour cell voltage of 2.07V will fall into three capacity spans: 70–80, 80–90 and 90–100.

Once the potential capacity spans are determined, another series of calculations occur that indicate the "strength" of the cell's voltage within a particular span. The strength is indicative of the probability of the voltage falling within a specific 10% span. The strength is calculated as follows: the average voltage is calculated for each capacity range using the max and min voltage values. The cell under test voltage (open, one, three or four hour) is divided by this average, then the quotient is subtracted from one and the absolute value of this difference is obtained. Using this same formula, the numbers are obtained from the cell under test open, one, three and four-hour cell voltages. The values of the four are added and the sum is divided by seventy (70) and the quotient subtracted from one. This yields the final strength value for that capacity range which can be positive or negative.

Each capacity range produces a strength value determined by the above formulas and using the same cell under test voltages. The capacity range with the most positive strength value (highest probability that the cell is within that capacity range) is allowed to keep its full 10% range. The neighboring ranges are adjusted by the value of their strength. The range that is immediately above the strongest range gets it strength value added to its lowest capacity value, which yields the upper capacity limit. The range that is immediately below the strongest range gets it strength value subtracted from its highest capacity value, which yields the lower capacity limit. This delta from the two limits produces a high and low range span from the fuzzification portion of the prediction algorithm. For example:

| Capacity (%) | Strength Value | |
|---|---|---|
| 90–100 | 3 | |
| 80–90 | 9 | <Strongest strength value |
| 70–80 | 5 | |

Upper capacity limit: 90+3=93
Lower capacity limit: 80–5=75
Final fuzzification capacity range span =93–75=18 with the limits as the upper and lower capacity limits.

The neural network portion of the capacity prediction algorithm is used to narrow the capacity span obtained in the fuzzification portion. The neural network receives the open (data point #1), one-hour (data point #2), three-hour (data point #3), and four-hour (data point #4) cell voltages and the age (data point #8), of the batteries. Three more data points are obtained from these input voltages, they are: the slope of the discharge curve (data point #5), the delta between voltages at three and four hours (data point #6), and the proximity to two volts of the four hour voltage (data point #7). The slope (data point #5) of the discharge curve is calculated by taking the difference of the one and four hour cell voltages and dividing by three. The delta (data point #6) between three and four hours is simply the difference between the two values. Data point #7 is determined by subtracting the number two from the four-hour voltage and dividing the difference by the slope (data point #5). This calculation for data point #7 determines the proximity of the four-hour cell voltage to two volts. These eight data points are input to the neural network and the output of the network produces a number between zero and one. The neural network performs its calculations as any standard neural net using the coefficients determined from the training of the network using the lab data.

The output of the neural net is multiplied by the span of the capacity range obtained from the fuzzification portion (18 in the example above). This product is added to the low range value (75 in the example above) and this sum is the final capacity prediction of the algorithm.

What is claimed is:

1. A method of monitoring the capacity of a valve regulated lead acid battery, comprising:
   connecting at least one battery monitor to said valve regulated lead acid battery;
   connecting said monitor to a centralized system through an industry standard data system that collects and transfers data from the field to a central office;
   providing said centralized system with an alarm;
   performing a short-term discharge test on said battery using said battery monitor; and
   obtaining a predicted capacity using a neural network and fuzzy logic network in combination with a prediction algorithm;
   training said neural network for a specific battery type in a lab by determining the actual capacity of a battery, inputting parameters with the actual capacity used as a target, and programming the set of coefficients yielded by said neural network in said battery monitor;
   wherein, said discharge test provides input parameters for said networks which in combination with said prediction algorithm calculate said predicted capacity, and wherein, said alarm is activated when said predicted capacity falls below a predetermined percentage, when an individual cell voltage is reduced to about 1.95 volts or less, or when a system failure occurs.

2. A method as in claim 1, wherein said battery monitor consists of hardware for monitoring the voltages of each battery cell and currents that are flowing into and out of said battery.

3. A method as in claim 1, wherein said battery monitor contains a serial port enabling data to be downloaded onto a network, computer, or printer.

4. A method as in claim 3, further comprising a real time clock.

5. A method as in claim 4, wherein said real time clock is automatically verified and updated through said network.

6. A method as in claim 1, wherein said discharge test is a four hour discharge test.

7. A method as in claim 1, wherein said discharge test collects specific data parameters including the cell age, open circuit voltage, voltage after one hour of discharge, voltage after three hours of discharge, and voltage after four hours of discharge.

8. A method as in claim 7, wherein said parameters are used to derive three additional data points including the slope of the discharge curve, the delta between voltages at three and four hours, and the proximity to two volts of the four hour voltage.

9. A method as in claim 1, wherein said discharge test is performed on a repeated basis.

10. A method as in claim 1, wherein said actual capacity is determined by the following formula:

(time to discharge to 1.75V×24 hour discharge rate)/(24× 24-hour discharge rate in amps).

11. A method as in claim 1, wherein said neural network is trained only once.

12. A method as in claim 1, wherein said fuzzy logic network comprises:

dividing total battery capacity into capacity spans of ten percent;

associating a voltage range with each of said ten percent spans, wherein said voltage range was previously determined from said 24-hour rate discharge lab tests;

determining within which of said capacity spans said voltage ranges fall by comparing each of said open, one, three, and four hour cell voltages with the known base lines for the specific battery type;

determining the strength value of the cell's voltage within a particular span;

determining the capacity range with the most positive strength value;

adjusting the range that is immediately above said capacity range with most positive strength value by adding the strength value of said range to the lowest capacity value of said range to yield the upper capacity limit;

adjusting the range that is immediately below said capacity range with most positive strength value by subtracting the strength value of said range from the highest capacity value of said range to yield the lower capacity limit;

wherein, said difference between said upper capacity limit and said lower capacity limit yields the fuzzy logic capacity range span.

13. A method as in claim 12, wherein said strength value is determined as follows:

calculating the average voltage for each capacity range using the maximum and minimum voltage values;

dividing the cell test voltage (open, one, three, or four hour) by said average voltage;

subtracting the quotient of previous step from one and taking the absolute value of the difference;

performing this calculation for each of said cell test voltages—open one, three, and four hour, adding the calculated values for each of said cell test voltages and dividing the sum by seventy; and subtracting the quotient of the previous step from one;

wherein, the value of said strength value can be positive or negative.

14. The method of claim 1, wherein said neural network comprises:

inputting parameters including open, one-hour, three-hour, and four-hour cell voltages and the age of said battery;

obtaining three more data points from said parameters including slope of the discharge curve, the delta between voltages at three and four hours, and the proximity to two volts of the four hour voltage;

outputting a number between zero and one;

wherein, said neural network performs calculations as any standard neural network using the coefficients determined from said training of said network using lab data; and wherein, the output of said neural network is multiplied by the span of the capacity range obtained from the fuzzy logic network and adding this product to said lower capacity limit in order to determine the final capacity prediction.

15. An apparatus for monitoring the capacity of a valve regulated lead acid battery, comprising:

at least one battery monitor connected to said valve regulated lead acid battery, said battery monitor having a neural network trained in a lab for a specific battery type by determining the actual capacity of a battery, inputting parameters with the actual capacity used as a target, and programmed with a set of coefficients yielded by said neural network and a fuzzy logic network;

a prediction algorithm, said prediction algorithm using data produced by said neural network and fuzzy logic network, a centralized system connecting said battery monitor through an industry standard data system to a central office;

an alarm connected to said centralized system.

16. An apparatus as in claim 15, wherein said battery monitor consists of hardware for monitoring the voltages of each battery cell and currents that are flowing into and out of said battery.

17. An apparatus as in claim 15, wherein said battery monitor contains a serial port enabling data to be downloaded onto a network, computer, or printer.

18. An apparatus as in claim 17, further comprising a real time clock.

19. An apparatus as in claim 18, wherein said real time clock is automatically verified and updated through said network.

20. A method of monitoring the capacity of a valve regulated lead acid battery, comprising:

connecting at least one battery monitor to said valve regulated lead acid battery;

connecting said monitor to a centralized system through an industry standard data system that collects and transfers data from the field to a central office;

providing said centralized system with an alarm;

performing a short-term discharge test on said battery; and obtaining a predicted capacity using a neural network and fuzzy logic network in combination with a prediction algorithm;

wherein, said discharge test comprises a four hour discharge of said battery, performed at a discharge rate calculated from the amp-hour size of the battery and a 24-hour period, during which specific data parameters consisting of cell age, open circuit voltage, voltage after one hour of discharge, voltage after three hours of discharge, and voltage after four hours of discharge are logged and three additional parameters including three hour slope, the delta between the three and four hour voltages, and the proximity to two volts of the four hour voltage are determined; and wherein said neural network is trained in a lab by determining the actual capacity of a battery using the following formula:

(time to discharge to 1.75V×24 hour discharge rate)/(24× 24-hour discharge rate in amps), inputting said parameters with the actual capacity used as a target, and programming the set of coefficients yielded by said neural network into an EEPROM which is inserted in said battery monitor; and wherein, said fuzzy logic network comprises dividing total battery capacity into capacity spans of ten percent; associating a voltage range with each of said ten percent spans, wherein said voltage range was previously determined from said 24 hour rate discharge lab tests; determining within which of said capacity spans said voltage ranges fall by comparing each of said open, one, three, and four hour cell voltages with the known base lines for the specific battery type; determining the strength value of the cell's voltage within a particular span by the following steps:

calculating the average voltage for each capacity range using the maximum and minimum voltage values; dividing the cell test voltage (open, one, three, or four hour) by said average voltage; subtracting the quotient of previous step from one and taking the absolute value of said answer; performing this calculation for each of cell test voltages (open one, three, and four hour); adding the calculated values for each of said cells test voltages and dividing the sum by seventy; and subtracting the quotient of the previous step from one; determining the capacity range with the most positive strength value; adjusting the range that is immediately above said capacity range with most positive strength value by adding the strength value of said range to the lowest capacity value of said range to yield the upper capacity limit; and adjusting the range that is immediately below said capacity range with most positive strength value by subtracting the strength value of said range from the highest capacity value of said range to yield the lower capacity limit; wherein, said difference between said upper capacity limit and said lower capacity limit yields the fuzzy logic capacity range span; and wherein, said neural network comprises inputting parameters including open, one-hour, three-hour, and four-hour cell voltages and the age of said battery; obtaining three more data points from said parameters including slope of the discharge curve, the delta between voltages at three and four hours, and the proximity to two volts of the four hour voltage; and outputting a number between zero and one; wherein, said neural network performs calculations as any standard neural net using the coefficients determined from said training of said network using lab data; and wherein, the output of said neural network is multiplied by the span of the capacity range obtained from the fuzzy logic network and adding this product to said lower capacity limit in order to determine the final capacity prediction.

* * * * *